United States Patent

Lee et al.

[11] Patent Number: 5,771,243
[45] Date of Patent: Jun. 23, 1998

[54] METHOD OF IDENTIFYING REDUNDANT TEST PATTERNS

[75] Inventors: Robert G.- H. Lee, Taipei; Y. C. Chui, Hsinchu Hsien, both of Taiwan

[73] Assignee: Etron Technology, Inc., Hsin-Chu, Taiwan

[21] Appl. No.: 796,353

[22] Filed: Feb. 7, 1997

[51] Int. Cl.[6] ..................................................... G06F 11/00
[52] U.S. Cl. .......................................................... 371/27.1
[58] Field of Search ................................ 371/27.1, 22.1; 364/579; 324/158 R

[56] References Cited

U.S. PATENT DOCUMENTS 4,801,870  1/1989  Eichelberger et al. .................... 324/73
5,434,869  7/1995  Maekawa et al. ......................... 371/27
5,479,414  12/1995  Keller et al. ............................ 371/22.3

Primary Examiner—Vincent P. Canney
Attorney, Agent, or Firm—George O. Saile; Stephen B. Ackerman

[57] ABSTRACT

This invention demonstrates a technique to determine potentially redundant test patterns for a complex integrated circuit device. The technique utilizes test data from a large sample of product, thus including the effects of the process line and the actual design. Included in the technique is the ability to determine single redundant tests as well as multiple tests that are redundant to either other single or multiple tests. Once a potentially redundant test or group of tests are identified, steps are be taken to determine whether the redundant test can be removed for the test sequence.

14 Claims, 4 Drawing Sheets

| 80 | 1 | 2 | 3 | 4 | 5 | 6 | 7 | 8 |
|---|---|---|---|---|---|---|---|---|
| 81 — A | F | P | F | P | F | P | F | P |
| 82 — B | F | F | P | P | F | F | P | P |
| 83 — C | F | F | F | F | P | P | P | P |
| 84 — m | $m_1$ | $m_2$ | $m_3$ | $m_4$ | $m_5$ | $m_6$ | $m_7$ | $m_8$ |

FIG. 5

| 90 | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| 91 — A | F | P | F | P | F | P | F | P | F | P | F | P | F | P | F | P |
| 92 — B | F | F | P | P | F | F | P | P | F | F | P | P | F | F | P | P |
| 93 — C | F | F | F | F | P | P | P | P | F | F | F | F | P | P | P | P |
| 94 — D | F | F | F | F | F | F | F | F | P | P | P | P | P | P | P | P |
| 95 — m | $m_1$ | $m_2$ | $m_3$ | $m_4$ | $m_5$ | $m_6$ | $m_7$ | $m_8$ | $m_9$ | $m_{10}$ | $m_{11}$ | $m_{12}$ | $m_{13}$ | $m_{14}$ | $m_{15}$ | $m_{16}$ |

FIG. 6

METHOD OF IDENTIFYING REDUNDANT TEST PATTERNS

BACKGROUND OF THE INVENTION

1. Field of Invention

This invention relates to testing of integrated circuits and in particular to the reduction of existing test patterns.

2. Description of Related Art

Today's integrated circuits are a complex interconnection of semiconductor devices mostly contained internal to a clip and having few I/O terminals with which a set of test patterns can communicate. Testing to insure product quality requires a large combination of patterns in the attempt to detect potential manufacturing faults internal to the chip beyond the direct reach of the I/O terminals. Often test patterns are generated and compared to a fault model to determine if adequate fault coverage is accomplished by the generated patterns. Additional patterns are generated until some predetermined quality level is reached.

Almost all of the faults in integrated circuit devices are a result of either opens or shorts. Opens are more easily detected since they often result in a stuck condition that can be detected by a set of test patterns developed using a good machine model. Shorts on the other hand are not as easily detected and often cause the integrated circuit to operate as it was not intended. Sometimes slowing the performance of the integrated circuit device.

When a production line has been setup, fine toned and yielding product, there comes a time when a number of test patterns appear to be redundant because they do not provide any additional sorting of the product. This may be caused by the overlap in the fault coverage between test patterns or it may be a result of the lack of physical faults occurring in different areas of test patterns coverage ranging over a period of production. This not withstanding, there is a need for a method to find redundancy between test patterns in order to reduce test time and product cost.

In U.S. No. 4,801,870 (Eichelberger et al.) different sets of pseudo random patterns are applied to the inputs of an integrated circuit device and using LSSD (Level Sensitive Scan Design). The output responses are collected to form a "test signature" which is compared to a known good signature obtained by computer simulation. The input patterns are altered in a predetermined way to provide a weighted pseudo random set of test patterns, giving weight to the number and type of internal circuit elements that are directly or indirectly affected by the input patterns. This invention is used in replace of stuck fault test pattern generation using a stuck fault model and attempts to heighten the ability to quickly determine a failed integrated circuit device by weighting the pseudo random test patterns.

In U.S. Pat. No. 5,479,414 (Keller et al.) a technique is described to determine usefulness of the next test pattern in a LSSD design and thus reduce the number of test patterns that might have otherwise been. This "Look Ahead Pattern Generation and Simulation" is oriented toward LSSD and is implemented during pattern generation. It does not take into account the process line quality other than by the fault assumptions in the simulation model.

Referring to U.S. Pat. No. 5,434,869 (Maekawa et al.) a test pattern generating apparatus is described that uses analog techniques to test a sequential circuitry. The apparatus calculates an evaluation value depending on the degree of variance with historical data. Whereas this technique has applicability in areas where sequential circuitry exists, it is not generally applicable. Also if the number of logic circuits between tie input and output are sufficient, the collective circuit gain can be sufficient to only produce a logic level as an output, and the apparatus described is not necessary to test the output logic level.

It is important to minimize the number of test patterns necessary to test a complex integrated circuit device to reduce the associated costs. Most of tie attempts to do this is related to improving the state of the art of test pattern generation. The difficulty associated with any of this is detecting potential logic faults buried within an integrated circuit without having any direct access to the location of the potential fault. To further complicate the problem, open circuits are more easy to detect than shorted circuits. Shorted circuit detection being more incidental to logic test pattern testing, and more frequent with some form of performance testing. Being left out of the equation is the quality of die process line. A quality line does not necessarily produce all the faults that are assumed in pattern generation. Being able to include the quality of the process line into the formula for the tests being used, provides an important inclusion for reducing test patterns.

SUMMARY OF THE INVENTION

The technique described within this invention identifies potentially redundant test patterns leading to the reduction of the number of test patterns for integrated circuit devices. This is accomplished by analyzing the test results of a sample of product, and as a result includes the effects of the manufacturing process along with pattern generation and product design. The basic idea for identifying potentially redundant test patterns is to find a set of test patterns which can be replaced by another set of test patterns containing one or more test pattern. To accomplish this a large sample of integrated circuit product is tested to a full set of test patterns. The results of tile testing are analyzed to detect redundancy between test, patterns. For example, the results of two sets of test patterns, set A and set B, are selected from the testing of the product where each test set can contain one or more different patterns. If sets A and set B pass and fail together, then set A and set B are mutually redundant. Either set of lest patterns can replace the other, and the full set of test patterns can be reduced in number by which ever test pattern set is replaced. This then establishes a new reduced set of test patterns.

If one test pattern set passes when another set fails within a limited number of times, then the two sets of test patterns are conditionally redundant based on meeting a criteria that the one test pattern set fails less than a limited number of times while the other test pattern set passes. If test pattern set A produces a number of failures on the product sample that is less than acceptable number of failures while test pattern set B produces a pass condition, then test pattern set B can replace test pattern set A based on satisfying the condition of the limited number of failures. Test pattern set A can be removed from the test sequence establishing a new reduced set of test patterns.

Finding neither a mutual or conditional redundancy between test pattern set A and B, the two sets remain in the new reduced set of test patterns unless, or until, a redundancy with other test pattern sets are fouled. Thus (he reduced set of lest patterns is fornitilated from test patterns that have replaced other test patterns as well as test patterns for which no redundant conditions were found.

Verification that the new reduced set of test patterns does a proper job of testing the product is accomplished by first testing a sample of product with the reduced set of test patterns. Then separating the product into passing and failing groups and testing each group with the initial full set of test patterns. The product that failed the reduced set of patterns should also fail the initial set of patterns Since the test that produced the failure should be in both test sequences. Also product that passed the reduced set of patterns should pass the full set of patterns. Product that failed the reduced set of patterns should not pass the Rill set of patterns because the test producing the failure is in both sets of test sequences; however, product failing the full set of patterns after passing the reduced set of patterns is an indication of the conditional redundancy used to reduce the number of test patterns. If the number in this category is too large, some of the replaced patterns may have to be reinstated in the less sequence. It is this condition that needs monitoring for maintenance of product quality. This technique of first testing product with the reduced set of patterns, separating the product into pass and fail categories, and retesting (the product from both categories with the full set of patterns provides a means to monitor product quality, particularly the product that passes the reduced set and fails the full set of test patterns.

BRIEF DESCRIPTION OF THE DRAWINGS

This invention will be described with reference to the accompanying drawings, wherein:

FIG. 5 shows tile comparison of possible test results for three test patterns, and FIG. 6 shows the comparison of possible test results for four test patterns.

DETAILED DESCRIPTION OF THE PREFERRED EMBODIMENT

Figure 1:
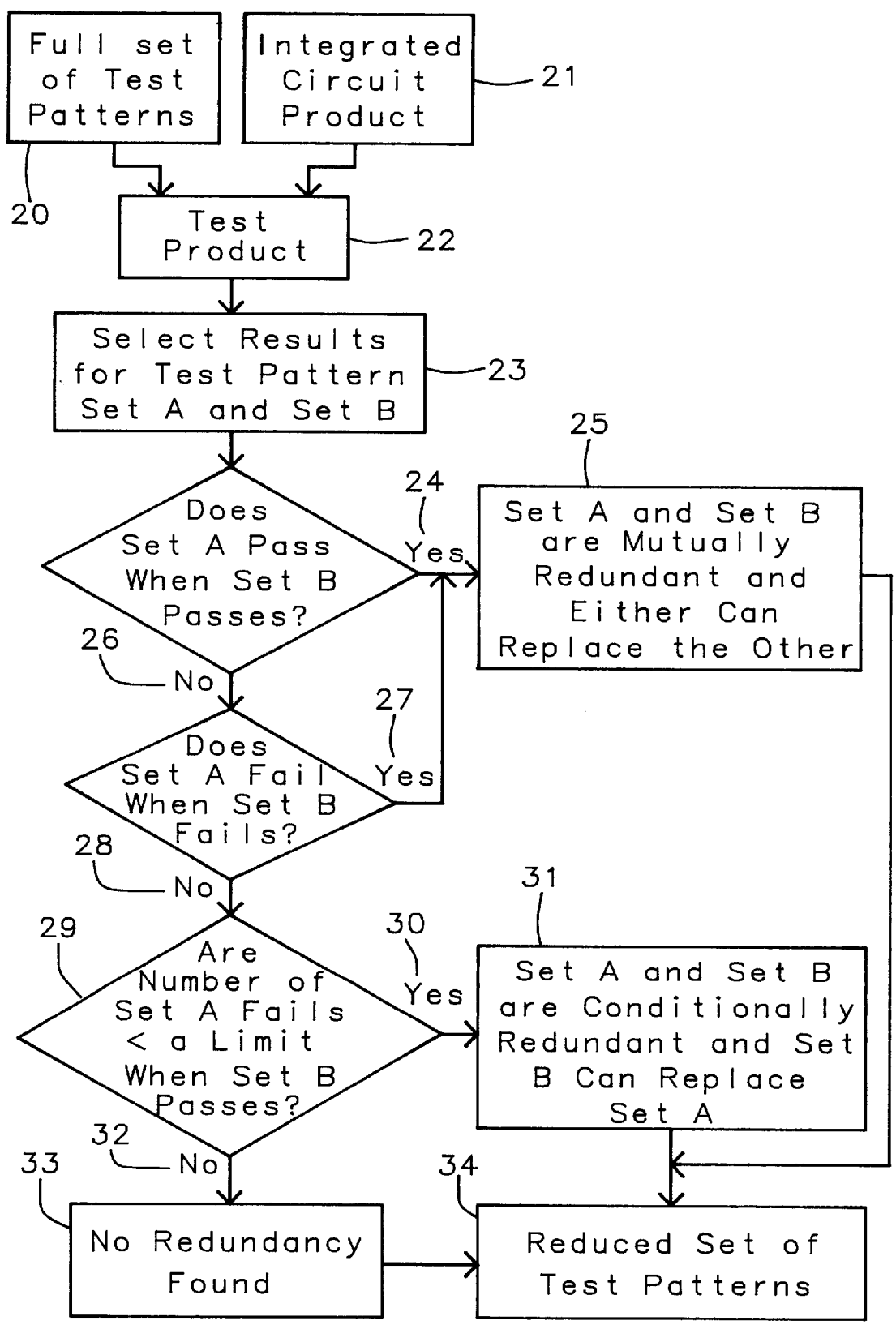
FIG. 1 is an overview of the process to detect redundant test patterns.

In FIG. 1 is shown a simplified process for determining redundant patterns and creating a new reduced set of patterns. A full set of test patterns 20 is used to test 22 a sample of integrated circuit product 21. From the results of this product test 22, two sets of test patterns, set A and set B, are selected 23. Set A and set B 23 can each be made up from the test results of one to several different test patterns. The results of the two test pattern sets 23 are then compared. If the sample of integrated circuit product 21 passed all tests in both set A and set B 24, the two sets of test patterns arc mutually redundant aid either sot can be replaced by the other 25. If the product did not pass bolt set A and set B tests 26 but failed all test contained within set A and set B 27, then the two sets of test patterns are mutually redundant and either set can be replaced by the other 25. If the results of test set A and test set B are neither all pass or all fail, then the results are evaluated to determine if thc number failures in one set is within a limit with the patterns in the other sot arc all pass 29. If the failures from test patterns in set A, for instance, are within an established limit when results from test pattern set B is pass for all test patterns 30, then the two sets are conditionally redundant and test set B can replace test set A 31. The conditional redundancy is based on the condition that number of failures from test set A continuing to be below the established limit when results from test B pass the product 29. If the number of failures in one test set exceeds the established limit when the other test set yields an "all pass" result 32, then no redundancy is found 33, and the patterns from both sets are put into the new reduced set of test patterns 34. Also the result of the reduction in test patterns from both the mutual 25 and conditional 31 redundancies that were found are added to tile new reduced set of test patterns 34.

Figure 2:
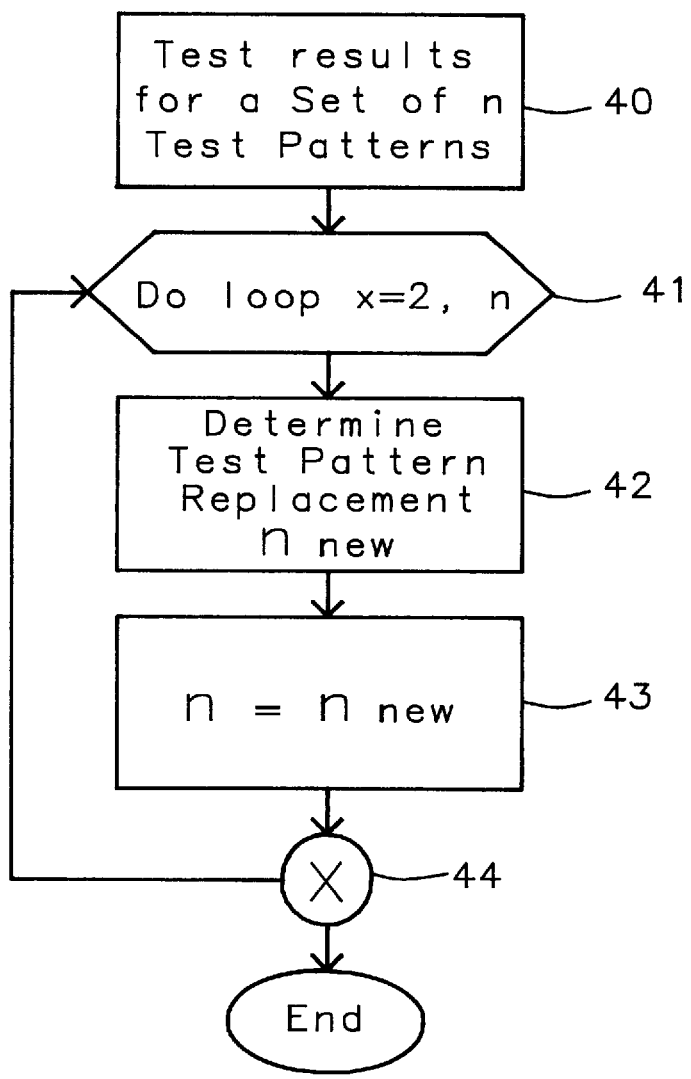
FIG. 2 shows the algorithm for detecting redundancy between test patterns.

Referring to FIG. 2, shown is the algorithm by which the analysis of the test data for redundant patterns is done. The test results for a set of n patterns 40 is fed through the analysis program controlled by a Do loop 41, 44. A test pattern replacement routine 42 looks at the results of each test on an individual basis or in combination with other tests to determine if each test or combination of tests can be replaced by other tests or combination of tests. If a replacement is found, the replacing test or combination of tests is made part of the new test set 43. If no replacement combination is found for a test or a set of tests, then those tests that cannot be replaced are added to the new test set 43. The Do loop is incremented 44 until all of ale original set of n test patterns 40 has been analyzed.

Figures 3, 4:
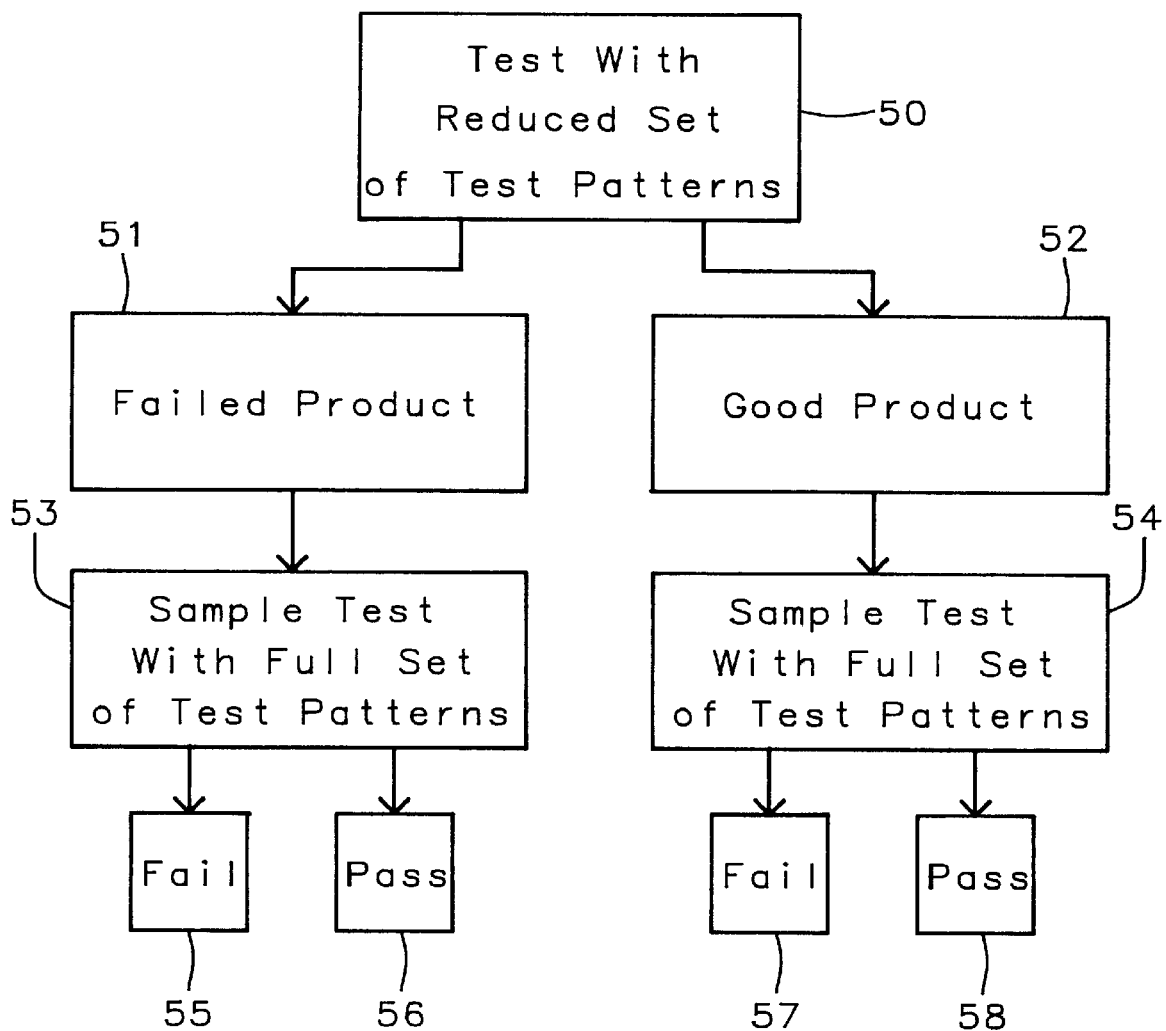
FIG. 3 shows a method for verification and quality assurance.
FIG. 4 shows tile comparison of possible test results for two test patterns.

The verification technique to check to see if tile new set of test patterns 43 is shown in FIG. 3. A sample of product is tested with the new reduced set of test patterns 50. The results are separated into failed product 51 and good product 52 as tested by the reduced set of test patterns 50. The failed product 51 is then tested with the original full set of test patterns 53. Product that fails the reduced set of test patterns 51 should also fail the first set of test patterns 55 since the test creating the failure is in both test sets. There should be little or no product that failed the reduced set of patterns 51 and passed the full set of patterns 56 since the test that failed the product is in both the full sets of patterns 53 and the reduced set of patterns 50.

Continuing to refer to FIG. 3, the good product 52 from tile test with the reduced set of test patterns 50 is tested with tile full set of test patterns 54. Product tested good 52 with the reduced set of test patterns 50 should also pass 58 the test with the fill set of test patterns 54. The fail category 57 from the test with the fill set of test patterns 54 could have a number of product in this failed category 57. This is the result of selecting conditional redundancy 31 to replace a test pattern or a set of test patterns. This also establishes a means by which product can be sampled for quality reasons throughout the production testing of product. For quality assurance good 52 and failed 51 product would be sampled during production testing and tested with the full set of test patterns 53, 54. If the failed category 57 exceeds an established quality limit, then adjustments to the reduced set of test patterns 50 may be appropriate. Equally if the pass category 56 from the full set of test patterns 53 shows any significant product, steps need to be taken to understand product in this pass category 56 since this is product that should otherwise have passed the reduced set of test patterns 50 and be part of the product that is shipped to a customer.

In FIG. 4 is shown a matrix 70 that displays all the possible fail and pass combinations between two test patterns, A 71 and B 72. The letter "F" in the matrix 70 indicates a fail and the letter "P" indicates a pass. The top row of the matrix shows the column number and the bottom row shows the designation m 73 representing the number of tested product that has the combination of pass and fail shown in each column. For instance, in column 2 test A 71 is a pass, test B 72 is a fail. The number of product 73 in this category of A 71 being a pass and B 72 being a full is represented by $m_2$ There are 4 possible combinations of patterns between the two tests A 71 and B 72, and the analysis to determine redundancy between any two patterns is $$C_2^n = \frac{n!}{2!(n-2)!}$$

where C is the total computations that must be made and n is the total number of test patterns. If there were 45 test patterns being analyzed then $$C_2^{45} = 990.$$

Continuing to refer to FIG. 4, the possible combination of the results of test A 71 and B 72 arc: fail-fail in column 1 with the number of product having this combination being $m_1$; pass-fail in column 2 with the number of product having this combination being $m_2$; fail-pass in column 3 with the number of product being $m_3$; and pass-pass in column 4 with the number of product being $m_4$. When the product either passes all tests or fails all tests, $m_2=0$ and $m_3=0$, the tests are mutually redundant and either test can replace the other. Wieil the product passes test pattern A 71 and fails test pattern B 72 as shown in column 2, test pattern B 72 is defined as conditionally redundant and B can be replaced by A if $$\frac{m_2}{m_2 + m_3} \leq \text{Limit},$$

or the number of product that fail test B 72 while passing test A 71 must be $m_2 < \text{Limit} \times (m_2+m_3)$ to allow test A 71 to replace test B 72. In like manner the test result combination shown in column 3 of FIG. 4, test A 71 is defined as conditionally redundant and can be replaced by test B 72 if $$\frac{m_3}{m_2 + m_3} \leq \text{Limit or } m_3 \leq \text{Limit} \times (m_2 + m_3).$$

In FIG. 5 there are a combination of three test shown in the matrix 80 with notation similar to the matrix 70 of FIG. 4. The three test patterns are A 81, B 82 and C 83 with in 84 representing the number of product that fall into each fail-pass category in each colunn of the matrix 80. Since there are three different tests, there are eight different fail-pass combinations and taking $$C_3^n = \frac{n!}{3!(n-3)!},$$

or 14190 computations for 45 test patterns, to analyze all possible combinations of one test being redundant to another test, one test being redundant to two tests and two tests being redundant to one test.

Continuing to refer to FIG. 5, when $m_2=m_3=m_4=m_5=m_6=m_7=($, all three tests are either all passed or all failed by the product, as shown in columns 1 and 8 of matrix 80. Under this condition all three tests are mutually redundant, and any of the three of the tests, A 81, B 82, or C 83, can replace any other. Similar to the discussion for two test patterns of FIG. 4., when $$\frac{m_2 + m_4 + m_6}{m_2 + m_3 + m_4 + m_5 + m_6 + m_7} \leq \text{Lim},$$

for columns 2, 4, and 6 in matrix 80 in FIG. 5, then tests B 82 and C 83 are conditionally redundant to test A 81 and can be replaced by A 81. While viewing all three columnist, 2, 4 and 6, it can be observed that test A 81 is a pass in all three and tests B 82 and C 83 either pass or fail The number of product permissible in the sum of these three columns is $$m_2 + m_4 + m_5 \leq \text{Limit} \times \sum_{x=2}^{7} m_2.$$

There are two other combinations of three test patterns where two test patterns can be conditionally redundant to the third test pattern. These are: tests A 81 and C 83 conditionally redundant to test B 82 where $m_3+m_4+m_7$ must meet a similar criteria; and A 81 and B 82 conditionally redundant to test C 83 where $m_5+m_6+m_7$ must meet the conditional redundancy requirement to allow the replacement of test A 81 and B 82.

Continuing to refer to FIG. 5, a single test, C 83, can be conditionally redundant to and replaced by two other tests, A 81 and B 82, if $$\frac{m_4}{m_2 + m_3 + m_4 + m_5 + m_6 + m_7} \leq \text{Lim},$$

or the number of product hi this category represented by column 4 must be $$m_4 \leq \text{Limit} \times \sum_{x=2}^{7} m_x.$$

there are two other categories, represented by columns 6 and 7 of matrix 80, where a single test could potentially be redundant to and replaced by two other tests. Test B 82 could be found conditionally redundant to tests A 81 and C 83 if $m_6$ is found to meet criteria similar to $m_4$, and test A 81 could be found conditionally redundant to tests B 82 and C 83 if $m_7$ would meet a similar criteria.

In FIG. 6 there arc fail-pass combinations for four test patterns shown in a matrix 90 of sixteen columns representing the various combinations. The analysis of four tests for various combinations of redundancy requires $$C_4^n = \frac{n!}{4!(n-4)!}$$

computations. When n=45 test patterns, there are 148995 computations required to determine all possible combinations of redundancy between the 4 test patterns. As with the previous combinations shown in FIG. 4 and FIG. 5 when $m_2$ through $m_{15}=0$, then all tests either produced a pass on a single product or all tests produced a fail, and all four tests an are Mutually redundant. As with the other combinations when the tests are mutually redundant, each can replace each other.

Continuing to refer to FIG. 6, when $$\frac{m_2 + m_4 + m_6 + m_8 + m_{10} + m_{12} + m_{14}}{m_2 + m_3 + \ldots + m_{14} + m_{15}} = \text{Lim},$$

then tests B 92, C 93, and D 94 arc collectively aid conditionally redundant to test A 91 aid can all be replaced by test A 91. For this particular combination $$\sum_{y=1}^{7} m_{2y} \leq \text{Limit} \times \sum_{x=2}^{15} m$$

is the limit to the amount of product that can be found in the test categories represented by columns 2, 4, 6, 8, 10, 12, and 14 of matrix 90. There are three other combinations in matrix 90 of four test patterns in which one test patterns can potentially replace the other three. These ire found in three different combinations of columns similar to columns 2, 4, 6, 8, 10, 12, and 14. The other columns in matrix 90 having collective and conditional redundancy of three patterns which are redundant to the remaining test pattern are: columns 3, 4, 7, 8, 11, 12, and 15, containing $m_3$, $m_4$, $m_7$, $m_8$, $m_{11}$, $m_{12}$, and $m_{15}$ where test B 91 can potentially replace tests A 91, C 93 and D 94; columns 5, 6, 7, 8, 13, 14, and 15, containing $m_5$, $m_6$, $m_7$, $m_8$, $m_{13}$, $m_{14}$ and $m_{15}$ where test C 93 call potentially replace tests A 91, B 92, and D 94; and columns 9, 10, 11, 12, 13, 14, and 15, containing $m_9$, $m_{10}$, $m_{11}$, $m_{12}$, $m_{13}$, $m_{14}$ and $m_{15}$ where test D 94 can potentially replace tests A 91, B 92, and C 93. These additional combinations of test results provide additional means to find conditional redundancy amongst the 4 test patterns and each must satisfy an inequality similar to the one for columns 2, 4, 6, 8, 10, 12, and 14.

Continuing to refer to FIG. 6, two tests, A 91 and B 92 can replace tests C 93 and D 94 if $$\frac{m_4 + m_8 + m_{12}}{m_2 + m_3 + \ldots + m_{14} + m_{15}} \leq \text{Limi}.$$

tests C 93 and D 94 are collectively and conditionally redundant to tests A 91 and B 92 collectively, and must produce no more product in the three categories represented by columns 4, 8, and 12 than $$\sum_{y=1}^{3} m_{4y} \leq \text{Limit} \times \sum_{x=2}^{15}$$

to satisfy the requirements of the conditional redundancy. There are four other combinations in matrix 90 of four test patterns in which two test patterns can potentially replace the other two. These are found in four different combinations of columns similar to columns 4, 8, and 12. The other columns in matrix 90 having collective and conditional redundancy of two patterns which are redundant to the other two test patterns are: columns 6, 8, and 14, containing $m_6$, $m_8$, and $m_{14}$ where tests A 91 and C 93 can potentially replace tests B 92 and D 94; columns 7, 8, and 15, containing $m_7$, $m_8$, and $m_{15}$ where tests B 92 and C 93 can potentially replace tests A 91 and D 94; columns 11, 12 and 15, containing $m_{11}$, $m_{12}$ and $m_{15}$ where tests B 92 and D 94 can potentially replace tests A 91 and C 93; and columns 13, 14 and 15, containing $m_{13}$, $m_{14}$, and $m_{15}$ where tests C 93 and D 94 can potentially replace tests A 91 and B 92. These additional combinations of test results provide additional means to find conditional redundancy amongst the 4 test patterns and each must satisfy an inequality similar to the one for columns 4, 8, and 12.

In column 8 of matrix 90 of FIG. 6 is a combination of pass and fail that allows one test pattern, D 94, to be replaced by three other test patterns, A 91, B 92, and C 93. In this case D 94 is conditionally redundant to the other three patterns and can be replaced if the following inequality is satisfied:

$$\frac{m_8}{m_2 + m_3 + \ldots + m_{14} + m_{15}} \leq \text{Limi}$$

and the quantity of product falling into this category is $$m_8 \leq \text{Limit} \times (m_2 + m_3 + \ldots + m_{14} + m_{15}).$$

test pattern D 94 is conditionally redundant to tests A 91, B 92, and C 93 collectively and can be replaced by test patterns A 91, B 92, and C 93 as long as the quantity of product represented by $m_8$ does not exceed the inequality. There are three other combinations in the matrix 90 of four test patterns in which one test pattern can potentially be replaced the other three. These are found in column 12 where test C 93 could be conditionally redundant to tests A 91, B 92, and D 94; column 14 where test B 92 could be conditionally redundant to A 91, C 93, and D 94; and column 15 where test A 91 could be conditionally redundant to B 92, C 93, and D 94. These additional combinations of test results provide additional means to find conditional redundancy amongst the 4 test patterns and each must satisfy an inequality similar to the one for column 8.

While the invention has been particularly shown and described with reference to preferred embodiments thereof, it will be understood by those skilled in the art that various changes in form and details may be made without departing from the spirit and scope of the invention.

What is claimed is:

1. A method for reducing the number of test patterns to test an integrated circuit product by removing redundant test patterns and thereby reducing test time, and comprising:

a) providing an initial set of test patterns,
   b) testing a sample of the integrated circuit product using said initial set of test patterns,
   c) selecting the results of a first and second set of test patterns, each separate and contained within the initial set of test patterns,
   d) replacing either set with the other when the results of testing with both sets of test patterns are all pass or all fail for each pattern in each set where the set replaced is redundant to the other set,
   e) replacing the first set of test patterns being redundant with the second set of test patterns when the first set of test patterns produces failures that are less than a limit of an acceptable number of failures, and occurring on the same sample of integrated circuits which pass the second set of test patterns,
   f) creating a reduced set of test patterns by removing from the initial set of test patterns those patterns that are redundant separately or collectively with other test patterns that are separate or in a group.

2. The method of claim 1, further comprising a method of verification using the initial set of test patterns, and comprising:

a) testing product with the reduced set of test patterns,
   b) selecting product which both passed and failed the reduced set of test patterns,
   c) testing the product that passed the reduced set of test patterns with the initial set of test patterns and separating the results into pass and fail,
   d) testing the product that failed the reduced set of test patterns with the initial set of test patterns and separating the results into pass and fail,
   e) determining the results of the testing with the reduced set of test patterns to be valid when product that passed the reduced set of test patterns also passed the initial set of tests, f) determining the results of the testing with a reduced set of test patterns to be acceptable when product that passed the reduced set of tests failed the initial set of tests in a quantity fewer than an acceptable limit of the number of product, g) determining the results of the testing with the reduced set of test patterns to be valid when product that fail the reduced set of test patterns also fail the initial set of tests, h) determining the results of the testing with the reduced set of test patterns to be valid when product that fail the reduced set of test patterns does not pass the initial set of tests since the failing test is a member of both the initial and reduced sets of test patterns, i) using the method of verification periodically to sample test product for quality assurance where a sample of product is used for verification.

3. The method of claim 1, further comprising a subroutine to determine test pattern replacement, and comprising:

a) selecting test results of a set of "n" test patterns for a product sample of integrated circuits, b) processing the test results through an analysis routine contained within a program Do loop, c) determining redundant test patterns based on replacement criteria and the pass and fail status of each test for the product sample of integrated circuits, d) removing the redundant test patterns from the set of "n" test patterns and setting "n" test patterns as "n(new), e) incrementing the Do loop until all test patterns, singularly or collectively, have been analyzed for redundancy.

4. A method for removing redundant tests from a set of four test patterns thereby reducing test time for an integrated circuit product, and comprising:

a) providing an initial set of N test patterns to test said integrated circuit product, b) running all N test patterns against a sample of said integrated circuit product, c) selecting any four test patterns designated as A, B, C and D, d) removing various combinations of the designated four test patterns, A, B, C and D, from the initial set of test patterns when the removed test patterns produced failures which were within an acceptable limit of failures and the product sample of integrated circuits passed all the remaining test patterns of the designated four test patterns.

5. The method of claim 4, wherein one test pattern can replace the other three of the set of four test patterns, and comprising:

a) selecting test patterns B, C and D from the group of four test patterns designated as A, B,C and D, b) removing test patterns B, C and D from the set four of test patterns when the sample of integrated circuit product fails tests B, C and D a number of times which is within a limit of an acceptable number failures and the integrated circuit passes test pattern A.

6. The method of claim 4, wherein two test patterns call replace the other two of the set of four test patterns, and comprising:

a) selecting test patterns C and from the group of four test patterns designated as A, B, C and D, b) removing test patterns C and D from the set of test patterns when the sample of integrated circuit product fails tests C and D a number of times which is within a limit of an acceptable number failures and the integrated circuit passes test patterns A and B.

7. The method of claim 4, wherein the test patterns can replace the remaining test pattern of the set of four test patterns, and comprising:

a) selecting a test pattern D firom the group of four test patterns designated as A, B, C and D, b) removing test pattern D from tie set of test patterns when the sample of integrated circuit product fails test D a number of times which is within a limit of an acceptable number failures and the integrated circuit passes test patterns A, B and C.

8. The method of claim 4, wherein any test pattern can replace any other of the set of four test patterns, and comprising:

a) selecting any set of four test patterns A, BS, C, or D), b) replacing any of test pattern of set A, B, C or D with any other test pattern of set A, B, C and D when the sample of integrated circuit product passes all tests of the set of four test patterns or fails all tests of the set of four tests.

9. A method for eliminating redundant tests from a set of three test patterns thereby reducing test time for an integrated circuit product, and comprising:

a) providing an initial set of test patterns to test said integrated circuit product, b) running all test patterns against a sample of integrated circuit product, c) selecting any three test patterns designated as A, B, and C d) removing various combinations of the designated three patterns, A, B, and C, From the initial set of test patterns when the removed test patterns produced failures which are within an acceptable limit of failures and the sample of integrated circuit product passes the remaining test patterns of the designated three test patterns.

10. The method of claim 9, wherein one test pattern can replace the other two of the set of three test patterns, and comprising:

a) selecting test patterns B and C from the group of three test patterns designated as A, B and C, b) removing test patterns B and C from the set of test patterns when the sample of integrated circuit product fails tests B and C a number of times which is within a limit of (a acceptable number failures and the sample of integrated circuit product passes test pattern A.

11. The method of claim 9, wherein two test patterns can replace the other one of the set of three test patterns, and comprising:

a) selecting test pattern A from the group of three test patterns designated as A, B and C, b) removing test pattern A from the set of test patterns when the sample of integrated circuit product fails test A a number of times which is within a limit of an acceptable number failures and the sample of integrated circuit product passes test patterns B and C.

12. The method of claim 9, wherein any test pattern can replace any other test pattern of the set of three test patterns, and comprising:

a) selecting any set of three test patterns A, B, and C b) replacing any of test pattern of set A, B and C with any other test pattern of set A, B and C when the sample of integrated circuit product passes all tests of the set of three test patterns or fails all tests of the set of three tests.

13. A method for replacing one redundant test with another test from a set of two test patterns thereby reducing test time for an integrated circuit, and comprising:
   a) providing an initial set of test patterns to test said integrated circuit,
   b) removing all test patterns against a sample of said integrated circuits product,
   c) selecting either test patterns designated as A and B,
   d) replacing either test A or test B of the designated two test patterns, A and B, with the other test pattern when the replaced test pattern produces a failure which is within a limit of an acceptable number of failures and the sample of integrated circuit product passes the other test pattern of the designated two test patterns.

14. The method of claim 13, wherein either test pattern can replace the other of the set of two test patterns, and comprising:
   a) selecting any set of two test patterns A and B,
   b) replacing either test pattern A or B with the other test pattern from the set of two test patterns when the sample of integrated circuit product passes both tests for the set of two test patterns or fails both tests for the set of two tests.

* * * * *